US 7,579,633 B2

(12) United States Patent
Sekiguchi

(10) Patent No.: US 7,579,633 B2
(45) Date of Patent: Aug. 25, 2009

(54) PHOTOELECTRIC CONVERSION DEVICE, IMAGE SENSOR, AND METHOD FOR MANUFACTURING PHOTOELECTRIC CONVERSION DEVICE

(75) Inventor: Yushi Sekiguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 354 days.

(21) Appl. No.: 10/566,667

(22) PCT Filed: May 2, 2005

(86) PCT No.: PCT/JP2005/008303

§ 371 (c)(1),
(2), (4) Date: Jan. 30, 2006

(87) PCT Pub. No.: WO2005/109511

PCT Pub. Date: Nov. 17, 2005

(65) Prior Publication Data

US 2008/0099868 A1    May 1, 2008

(30) Foreign Application Priority Data

May 7, 2004    (JP)    ............................ 2004-138723

(51) Int. Cl.
H01L 27/15    (2006.01)
(52) U.S. Cl. ................... 257/184; 257/258; 257/440; 257/E27.134; 257/E31.054
(58) Field of Classification Search ............ 257/440, 257/461, 184, 258, E27.134, E31.054
See application file for complete search history.

(56) References Cited

U.S. PATENT DOCUMENTS 4,654,685 A * 3/1987 Yamada ................... 257/184

| | | |
|---|---|---|
| 6,534,759 B1 | 3/2003 | Koscielniak et al. |
| 6,590,242 B1 | 7/2003 | Kozuka et al. |
| 6,646,318 B1 | 11/2003 | Hopper et al. |
| 2002/0096696 A1 | 7/2002 | Eom et al. |
| 2003/0057431 A1 | 3/2003 | Kozuka et al. |
| 2003/0189656 A1 | 10/2003 | Shinohara |
| 2003/0193586 A1 | 10/2003 | Hayakawa |
| 2004/0046194 A1 | 3/2004 | Kozuka et al. |

FOREIGN PATENT DOCUMENTS

| | | |
|---|---|---|
| JP | 58-14569 | 1/1983 |
| JP | 61-285760 | 12/1986 |
| JP | 8-316521 | 11/1996 |
| JP | 2000-228513 | 8/2000 |
| JP | 2000-312024 | 11/2000 |
| JP | 2001-53330 | 2/2001 |
| JP | 2003-86783 | 3/2003 |
| WO | WO 02/27804 | 4/2002 |

* cited by examiner

*Primary Examiner*—M. Wilczewski
*Assistant Examiner*—Tsz K Chiu
(74) *Attorney, Agent, or Firm*—Rabin & Berdo, P.C.

(57) ABSTRACT

A photoelectric conversion device includes a photoelectric conversion layer that is stacked on a semiconductor substrate and that has first, second, and third photoelectric conversion regions, and first, second, and third dividing regions. The first dividing region is formed at a predetermined depth from a surface of the photoelectric conversion layer in the first photoelectric conversion region, and divides the first photoelectric conversion region into a first surface side region closer to the surface thereof and a first substrate side region closer to the semiconductor substrate. The first dividing region has a through hole. The second dividing region is formed at substantially the same depth as the first dividing region or at a shallower depth than the first dividing region in the second photoelectric conversion region. The third dividing region is formed at a shallower depth than the second dividing region in the third photoelectric conversion region.

2 Claims, 9 Drawing Sheets

PHOTOELECTRIC CONVERSION DEVICE, IMAGE SENSOR, AND METHOD FOR MANUFACTURING PHOTOELECTRIC CONVERSION DEVICE

BACKGROUND OF THE INVENTION

1. Field of the Invention

This invention relates to a photoelectric conversion device that converts a quantity of light received in each of a plurality of light wavelength ranges into an electrical signal, a method for manufacturing the photoelectric conversion device, and an image sensor provided with the photoelectric conversion device.

2. Description of Related Art

An image sensor is provided with a photoelectric conversion device that converts a quantity of received light into an electrical signal. For example, a color image sensor that reads a color image is provided with a photoelectric conversion device having sensors (photodiodes) for red, green, and blue, respectively. A color filter that transmits only light of a color to be detected is disposed on a light incidence surface of the sensor for each color, and a signal corresponding to the quantity of light incident through the color filter is output from each sensor.

However, since this photoelectric conversion device must form the filter in a process for producing the device, a large number of steps are required, and manufacturing costs rise. Therefore, a photoelectric conversion device that does not use a filter for each color has been proposed (see Japanese Unexamined Patent Publication No. 8-316521).

FIG. 8 is a sectional view illustrating a photoelectric conversion device that has no filter.

This photoelectric conversion device 100 includes a p-type substrate 101 made of, for example, silicon and a p-type epitaxial layer 104 formed thereon. A field oxide film 107 is formed on the epitaxial layer 104. The field oxide film 107 has thicker parts formed at predetermined intervals than the other parts. An n-type diffusion layer 105 and an n-type buried layer 102 are formed between the thicker part of the field oxide film 107 and the p-type substrate 101.

Accordingly, the epitaxial layer 104 is divided into a plurality of sections, which serve as sensor I, sensor II, and sensor III, respectively. In sensors I, II, and III, a p-type base region 106 is formed in the center of the surface part of the epitaxial layer 104.

A p-type buried layer 103 is formed between the p-type substrate 101 and the epitaxial layer 104 of sensors II and III. Accordingly, the thickness of the epitaxial layer 104 of sensor II and the thickness of the epitaxial layer 104 of sensor III are smaller than that of sensor I. The thickness of the epitaxial layer 104 of sensor II is almost equal to that of sensor III.

A light absorbing member 108 that is made of, for example, polysilicon and that absorbs blue light to some degree is formed on the field oxide film 107 on sensors I and II.

In sensors I, II, and III, when light impinges thereon, a quantity of carriers (electron-hole pairs) corresponding to the quantity of incident light are generated in the epitaxial layer 104, and photocurrent (photoelectromotive force) corresponding to the number of holes is taken out through the base region 106.

Herein, since the optical-absorption coefficient of the epitaxial layer 104 becomes smaller as the wavelength of incident light becomes longer, light that enters the epitaxial layer 104 from the surface thereof can reach a deeper place as the wavelength becomes longer. Therefore, if the epitaxial layer 104 is small in thickness, long-wavelength light (for example, red light) will not be sufficiently absorbed.

In the photoelectric conversion device 100, the epitaxial layer 104 of sensor I is formed to have a thickness capable of absorbing light in a wide wavelength range from red light to blue light, whereas the epitaxial layer 104 of sensors II and III is formed to have a thickness capable of absorbing light in a wavelength range chiefly from green light to blue light.

Attention will now be paid to the presence or absence of the light absorbing member 108 that absorbs blue light. Since the light absorbing members 108 are provided on sensors I and II, respectively, red light and green light enter the epitaxial layer 104 of sensors I and II. Therefore, sensor I generates a photocurrent corresponding to the quantity chiefly of red light and green light, and sensor II generates a photocurrent corresponding to the quantity chiefly of green light. On the other hand, since the light absorbing member 108 is not provided on the sensor III, red light, green light, and blue light enter sensor III. Therefore, sensor III generates a photocurrent corresponding to the quantity chiefly of green light and blue light.

Thus, since sensors I, II, and III differ from each other in a combination of red light, green light, and blue light, which are to be absorbed so as to generate a photocurrent, the quantity of red light, the quantity of green light, and the quantity of blue light can be calculated by arithmetic processing based on the magnitude of the photocurrent generated by sensors I, II, and III.

However, since the light absorbing member 108 is required to be provided even in the thus structured photoelectric conversion device, manufacturing costs could not be sufficiently reduced.

Additionally, it is necessary to connect signal extracting electrodes to the base regions 106, respectively. Therefore, openings to thread the signal extracting electrodes must be formed in the light absorbing member 108, thus causing an increase in cost.

Additionally, normally, a semiconductor layer to absorb light and generate carriers is depleted when the photoelectric conversion device is driven. Voltage needed for depletion becomes larger correspondingly with an increase in thickness of the semiconductor layer. Therefore, a large voltage is needed to deplete a semiconductor region thickened to absorb long-wavelength light, and hence a driving voltage of the photoelectric conversion device was large, and a driving voltage of an image sensor including the photoelectric conversion device was large.

SUMMARY OF THE INVENTION

An object of the present invention is to provide a photoelectric conversion device capable of reducing manufacturing costs.

Another object of the present invention is to provide an image sensor capable of reducing manufacturing costs.

Still another object of the present invention is to provide a method for manufacturing a photoelectric conversion device capable of reducing manufacturing costs.

Still another object of the present invention is to provide a photoelectric conversion device having a low driving voltage.

Still another object of the present invention is to provide an image sensor having a low driving voltage.

The photoelectric conversion device according to a first aspect of the present invention includes a first conductivity type photoelectric conversion layer stacked on a semiconductor substrate; a second conductivity type element dividing region that is formed in the photoelectric conversion layer and by which the photoelectric conversion layer is divided into a first photoelectric conversion region, a second photoelectric conversion region, and a third photoelectric conversion region along the semiconductor substrate; a first dividing region of the second conductivity type that is formed at a predetermined depth from a surface of the photoelectric conversion layer in the first photoelectric conversion region, by which the first photoelectric conversion region is divided into a first surface side region closer to the surface thereof and a first substrate side region closer to the semiconductor substrate, the first dividing region having a through hole through which the first surface side region and the first substrate side region communicate with each other; a second dividing region of the second conductivity type that is formed at substantially the same depth as the first dividing region or at a shallower depth than the first dividing region in the second photoelectric conversion region and by which the second photoelectric conversion region is divided into a second surface side region closer to the surface thereof and a second substrate side region closer to the semiconductor substrate; and a third dividing region of the second conductivity type that is formed at a shallower depth than the second dividing region in the third photoelectric conversion region and by which the third photoelectric conversion region is divided into a third surface side region closer to the surface thereof and a third substrate side region closer to the semiconductor substrate.

According to the present invention, the second dividing region is formed at substantially the same depth from the surface of the photoelectric conversion layer as the first dividing region or is formed at a shallower depth than the first dividing region. The third dividing region is formed at a shallower depth from the surface of the photoelectric conversion layer than the second dividing region.

Therefore, if the first, second, and third dividing regions are almost the same in thickness, the thickness of the first surface side region is almost the same as that of the second surface side region, or is greater than that of the second surface side region. The thickness of the second surface side region is greater than that of the third surface side region.

Since the first dividing region has the through hole, carriers generated in the first substrate side region can be moved to the first surface side region through the through hole. Therefore, if the first surface side region is connected to a signal extracting electrode, carriers generated both in the first surface side region and in the first substrate side region can be moved to the signal extracting electrode connected to the first surface side region. Therefore, a diode (hereinafter, referred to as "first photodiode") made up of the first surface side region of the first conductivity type, the first substrate side region of the first conductivity type, and the first dividing region of the second conductivity type can generate a quantity of photocurrent (photoelectromotive force) corresponding to the quantity of carriers generated in the first surface side region and in the first substrate side region.

On the other hand, if each of the second and third surface side regions is connected to a signal extracting electrode, carriers generated in the second and third surface side regions can move to the signal extracting electrodes, respectively. However, carriers generated in the second and third substrate side regions are obstructed by the second and third dividing regions, and cannot move to the signal extracting electrodes.

Therefore, in a diode (hereinafter, referred to as "second photodiode") made up of the second surface side region and the second dividing region, only a quantity of photocurrent (photoelectromotive force) corresponding to the quantity of carriers generated in the second surface side region is generated, and, in a diode (hereinafter, referred to as "third photodiode") made up of the third surface side region and the third dividing region, only a quantity of photocurrent (photoelectromotive force) corresponding to the quantity of carriers generated in the third surface side region is generated.

Herein, since the optical-absorption coefficient of the photoelectric conversion layer becomes smaller as wavelength of incident light increases, light that enters the photoelectric conversion layer from the surface thereof reaches a deeper place as the wavelength of the light becomes longer. Therefore, the first surface side region and the first substrate side region absorb light in a wide wavelength range (short wavelength range, medium wavelength range, and long wavelength range) extended to the side of longer wavelengths than the second and third surface side regions, and can generate a quantity of carriers corresponding to the quantity of such light. Accordingly, the first photodiode generates photocurrent (photoelectromotive force) corresponding to the quantity of the carriers.

The second surface side region absorbs light in a wavelength range (short wavelength range and medium wavelength range) extended to the side of longer wavelengths than the third surface side region, and can generate a quantity of carriers corresponding to the quantity of such light. Accordingly, the second photodiode generates photocurrent (photoelectromotive force) corresponding to the quantity of the carriers. The third surface side region absorbs light in a narrow wavelength range on the side of shorter wavelengths, and can generate a quantity of carriers corresponding to the quantity of such light. Accordingly, the third photodiode generates photocurrent (photoelectromotive force) corresponding to the quantity of the carriers.

Therefore, the quantities of three kinds of light (e.g., red light, green light, and blue light) in different wavelength ranges can be calculated by arithmetic processing based on photocurrent (photoelectromotive force) generated in the first, second, and third photodiodes.

Thus, since the first, second, and third photodiodes have mutually different wavelength dependence, this photoelectric conversion device can detect the quantity of light in each of three kinds of different wavelength ranges without filters or light absorbing members. Therefore, there is no need to form filters or light absorbing members in a process for producing the photoelectric conversion device. Therefore, the photoelectric conversion device can be reduced in manufacturing costs.

When the quantity of light is measured by this photoelectric conversion device, a reverse bias voltage is applied to the first to third photodiodes, so that the first to third photodiodes can be depleted. Since voltage needed to deplete the semiconductor layer depends on the thickness of the semiconductor layer, voltage needed to almost completely deplete the first surface side region and the first substrate side region (the first photoelectric conversion region) is smaller than a case in which the first dividing region is not provided.

For example, each element dividing region may include the second conductivity type diffusion dividing region connected to the first to third dividing regions. In this case, the photoelectric conversion device may include the second conductivity type common electrode layer commonly connected to each diffusion dividing region.

In this case, the first to third dividing regions, the diffusion dividing region, and the common electrode layer have the same conductivity type, and hence a reverse bias voltage can be applied to the first to third photodiodes together through the common electrode layer.

For example, the common electrode layer may be provided between the semiconductor substrate and the photoelectric conversion layer.

Preferably, the element dividing region includes an insulation part formed in the surface part of the photoelectric conversion layer (diffusion dividing region). This insulation part makes it possible to reduce a leakage current between regions divided by the element dividing region in the surface part of the photoelectric conversion layer. When the photoelectric conversion layer is made of silicon, an oxide film formed by selectively oxidizing a predetermined area of the surface part of the photoelectric conversion layer (diffusion dividing region), for example, according to a LOCOS technique can be used as the insulation part.

Preferably, the first to third uppermost surface part regions of the second conductivity type are formed in the surface parts of the first to third surface side regions. The first to third uppermost surface part regions and the first to third surface side regions constitute photodiodes (hereinafter, referred to as "first to third surface photodiodes", respectively). The first to third photodiodes and the first to third surface photodiodes formed up and down can generate a large quantity of photocurrent corresponding to the quantity of light received at those positions.

If the element dividing region includes the diffusion dividing region connected to the common electrode layer, the uppermost surface part region may be connected to the diffusion dividing region.

In this case, a reverse bias voltage can be applied to the first to third photodiodes and the first to third surface photodiodes together through the common electrode layer.

The photoelectric conversion device according to a second aspect of the present invention includes a first conductivity type photoelectric conversion layer stacked on a semiconductor substrate and a second conductivity type dividing region that is formed at a predetermined depth from a surface of the photoelectric conversion layer, by which the photoelectric conversion layer is divided into a surface side region closer to the surface thereof and a substrate side region closer to the semiconductor substrate, the dividing region having a through hole through which the surface side region and the substrate side region communicate with each other.

According to the present invention, since the dividing region has the through hole, the surface side region and the substrate side region communicate with each other through the through hole. Therefore, if the surface side region is connected to a signal extracting electrode, carriers generated both in the surface side region and in the substrate side region by allowing light to enter these regions can move to the signal extracting electrode.

On the other hand, since the dividing region lies between the surface side region and the substrate side region, a depletion layer can be formed to extend not only from the outer surface of the photoelectric conversion layer but also from the inside of the photoelectric conversion layer, i.e., from an interface between the surface side region and the dividing region and an interface between the substrate side region and the dividing region.

Therefore, even when the total thickness of the surface side region and the substrate side region is set to become large, for example, in order to absorb light in a wide wavelength range including red light, voltage needed to almost completely deplete the surface side region and the substrate side region can be made smaller than a case in which the dividing region is not formed. In other words, the driving voltage of this photoelectric conversion device is low.

An image sensor according to a third aspect of the present invention includes a photoelectric conversion device and a drive circuit to drive the photoelectric conversion device. The photoelectric conversion device includes a first conductivity type photoelectric conversion layer stacked on a semiconductor substrate; a second conductivity type element dividing region that is formed in the photoelectric conversion layer and by which the photoelectric conversion layer is divided into a first photoelectric conversion region, a second photoelectric conversion region, and a third photoelectric conversion region along the semiconductor substrate; a first dividing region of the second conductivity type that is formed at a predetermined depth from a surface of the photoelectric conversion layer in the first photoelectric conversion region, by which the first photoelectric conversion region is divided into a first surface side region closer to the surface thereof and a first substrate side region closer to the semiconductor substrate, the first dividing region having a through hole through which the first surface side region and the first substrate side region communicate with each other; a second dividing region of the second conductivity type that is formed at substantially the same depth as the first dividing region or at a shallower depth than the first dividing region in the second photoelectric conversion region and by which the second photoelectric conversion region is divided into a second surface side region closer to the surface thereof and a second substrate side region closer to the semiconductor substrate; and a third dividing region of the second conductivity type that is formed at a shallower depth than the second dividing region in the third photoelectric conversion region and by which the third photoelectric conversion region is divided into a third surface side region closer to the surface thereof and a third substrate side region closer to the semiconductor substrate.

Since the image sensor of the present invention has no need to form a filter or a light absorbing member on the photoelectric conversion device, manufacturing costs can be reduced.

An image sensor according to a fourth aspect of the present invention includes a photoelectric conversion device and a drive circuit to drive the photoelectric conversion device. The photoelectric conversion device includes a first conductivity type photoelectric conversion layer stacked on a semiconductor substrate; and a second conductivity type dividing region that is formed at a predetermined depth from a surface of the photoelectric conversion layer, by which the photoelectric conversion layer is divided into a surface side region closer to the surface thereof and a substrate side region closer to the semiconductor substrate, the dividing region having a through hole through which the surface side region and the substrate side region communicate with each other.

Since the image sensor of the present invention includes the photoelectric conversion device capable of lowering its driving voltage, the driving voltage of the image sensor can be lowered.

A method for manufacturing a photoelectric conversion device according to a fifth aspect of the present invention includes a stacking step of stacking a first conductivity type photoelectric conversion layer on a semiconductor substrate; an element division step of forming a second conductivity type element dividing region that divides the photoelectric conversion layer into a first photoelectric conversion region, a second photoelectric conversion region, and a third photoelectric conversion region along the semiconductor substrate in the photoelectric conversion layer; a step of forming a first dividing region of the second conductivity type at a predetermined depth from a surface of the photoelectric conversion layer in the first photoelectric conversion region, the first dividing region dividing the first photoelectric conversion region into a first surface side region closer to the surface thereof and a first substrate side region closer to the semiconductor substrate, the first dividing region having a through hole through which the first surface side region and the first substrate side region communicate with each other, and forming a second dividing region of the second conductivity type at substantially the same depth as the first dividing region in the second photoelectric conversion region, the second dividing region dividing the second photoelectric conversion region into a second surface side region closer to the surface thereof and a second substrate side region closer to the semiconductor substrate; and a step of forming a third dividing region of the second conductivity type at a shallower depth than the second dividing region in the third photoelectric conversion region, the third dividing region dividing the third photoelectric conversion region into a third surface side region closer to the surface thereof and a third substrate side region closer to the semiconductor substrate.

According to this manufacturing method, it is possible to manufacture the photoelectric conversion device according to the first aspect of the present invention in which the second dividing region is formed at substantially the same depth from the surface of the photoelectric conversion layer as the first dividing region.

In the step of forming the first dividing region and the second dividing region, the first dividing region and the second dividing region are formed at substantially the same depth from the surface of the photoelectric conversion layer. Therefore, the first dividing region and the second dividing region can be formed together by simultaneously performing the steps of forming the first dividing region and the second dividing region.

The step of forming the first dividing region and the second dividing region may include a step of injecting second conductivity type impurities from the surface of the photoelectric conversion layer with predetermined injecting energy. In this case, the step of forming the third dividing region may include a step of injecting the second conductivity type impurities from the surface of the photoelectric conversion layer with smaller injecting energy than the predetermined injecting energy.

According to this structure, the first to third dividing regions are formed by injecting impurities from the surface of the photoelectric conversion layer. In this case, the respective depths at which the first to third dividing regions in the first to third photoelectric conversion regions are formed are determined by energy injecting the impurities. In more detail, the region-formed depth becomes greater as the impurities-injecting energy becomes greater. Therefore, the region-formed depths of the first to third photoelectric conversion regions can be controlled by the impurities-injecting energy.

Since impurities are injected with the same injecting energy (predetermined injecting energy) in the step of forming the first and second dividing regions, the first and second dividing regions are formed at the same depth from the surface of the photoelectric conversion layer.

On the other hand, since the impurities-injecting energy in the step of forming the third dividing region is smaller than the impurities-injecting energy in the step of forming the first and second dividing regions, the third dividing region is formed at a shallower depth from the surface of the photoelectric conversion layer than the first and second dividing regions.

In the step of forming the first dividing region, the impurities can be injected in a state in which a mask (e.g., a resist film) having a predetermined pattern is formed on the photoelectric conversion layer. For example, the mask may have a part with which a region corresponding to the through hole of the first dividing region is covered. In this case, the region corresponding to the through hole can be formed so that the impurities cannot be injected into the region. That is, the first dividing region having the through hole can be obtained.

A method for manufacturing a photoelectric conversion device according to a sixth aspect of the present invention includes a stacking step of stacking a first conductivity type photoelectric conversion layer on a semiconductor substrate; an element division step of forming a second conductivity type element dividing region in the photoelectric conversion layer, the element dividing region dividing the photoelectric conversion layer into a first photoelectric conversion region, a second photoelectric conversion region, and a third photoelectric conversion region along the semiconductor substrate; a step of forming a first dividing region of the second conductivity type at a predetermined depth from a surface of the photoelectric conversion layer in the first photoelectric conversion region, the first dividing region dividing the first photoelectric conversion region into a first surface side region closer to the surface thereof and a first substrate side region closer to the semiconductor substrate, the first dividing region having a through hole through which the first surface side region and the first substrate side region communicate with each other; a step of forming a second dividing region of the second conductivity type at a shallower depth than the first dividing region in the second photoelectric conversion region, the second dividing region dividing the second photoelectric conversion region into a second surface side region closer to the surface thereof and a second substrate side region closer to the semiconductor substrate; and a step of forming a third dividing region of the second conductivity type at a shallower depth than the second dividing region in the third photoelectric conversion region, the third dividing region dividing the third photoelectric conversion region into a third surface side region closer to the surface thereof and a third substrate side region closer to the semiconductor substrate.

According to this manufacturing method, it is possible to manufacture the photoelectric conversion device according to the first aspect of the present invention in which the second dividing region is formed at a shallower depth from the surface of the photoelectric conversion layer than the first dividing region.

The step of forming the first dividing region may include a step of injecting second conductivity type impurities from the surface of the photoelectric conversion layer with predetermined first injecting energy. In this case, the step of forming the second dividing region may include a step of injecting second conductivity type impurities from the surface of the photoelectric conversion layer with second injecting energy smaller than the first injecting energy. In this case, the step of forming the third dividing region may include a step of injecting second conductivity type impurities from the surface of the photoelectric conversion layer with third injecting energy smaller than the second injecting energy.

According to this structure, since the second injecting energy is smaller than the first injecting energy, the second dividing region can be formed at a shallower depth from the surface of the photoelectric conversion layer than the first dividing region. Additionally, since the third injecting energy is smaller than the second injecting energy, the third dividing region can be formed at a shallower depth from the surface of the photoelectric conversion layer than the second dividing region.

The above-mentioned and other objects, features, and advantageous effects of the present invention will be apparent from the embodiment described later with reference to the accompanying drawings.

DESCRIPTION OF THE PREFERRED EMBODIMENTS

Figure 1:
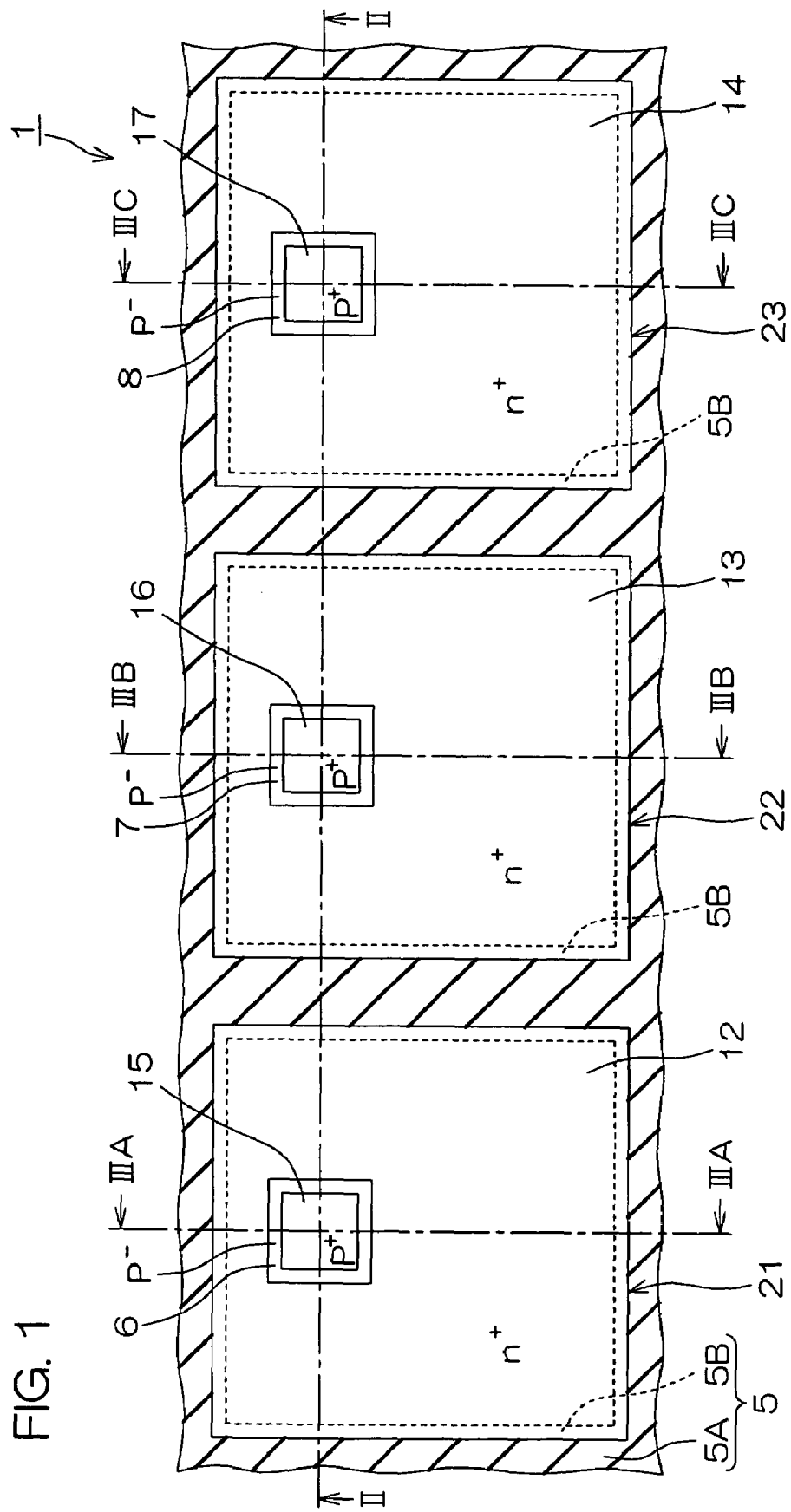
FIG. 1 is a schematic plan view showing a structure of a photoelectric conversion device according to a first embodiment of the present invention.
Figure 2:
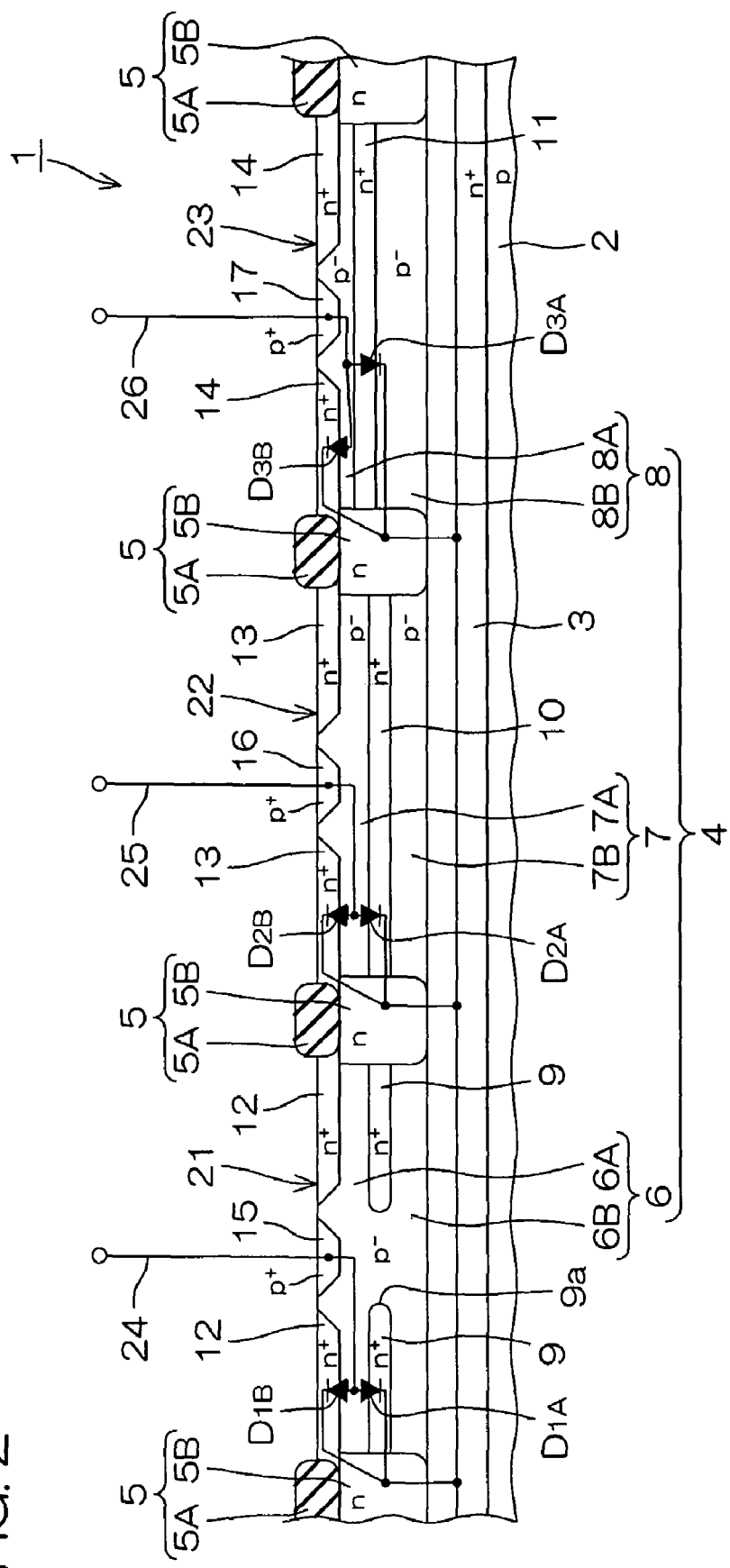
FIG. 2 is a sectional view along line II-II of FIG. 1.
Figure 3A:
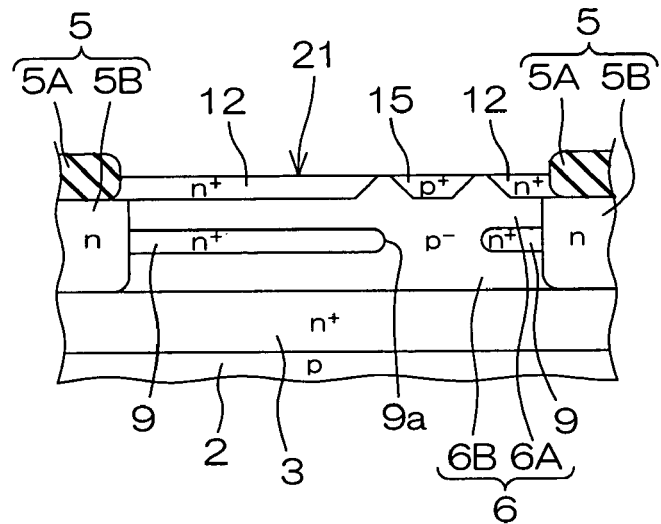
FIG. 3A is a sectional view along line IIIA-IIIA of FIG. 1.
Figure 3B:
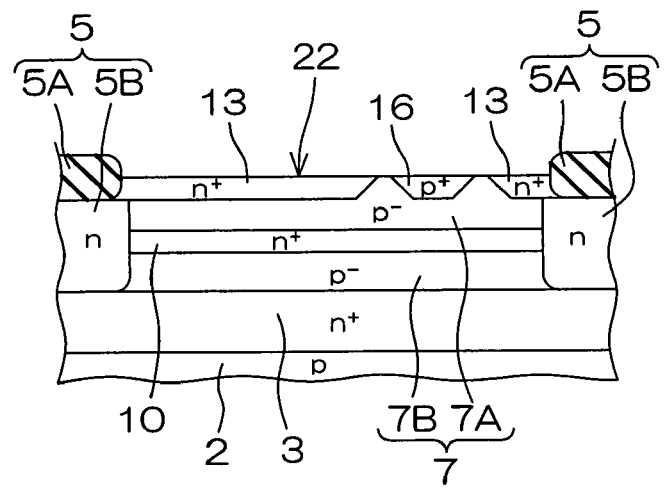
FIG. 3B is a sectional view along line IIIB-IIIB of FIG. 1.
Figure 3C:
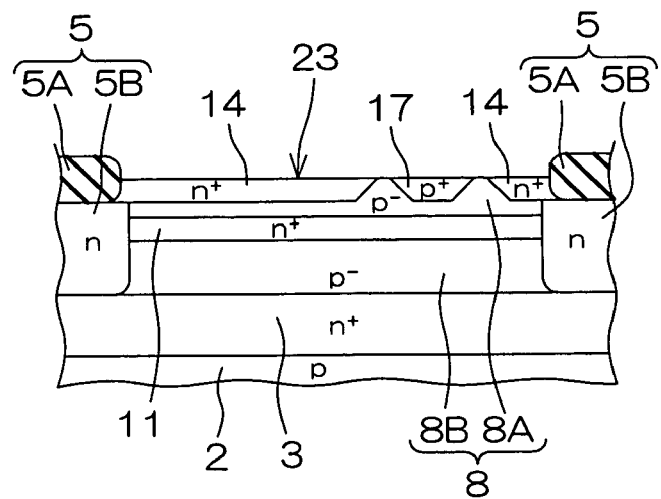
FIG. 3C is a sectional view along line IIIC-IIIC of FIG. 1.

FIG. 1 is a schematic plan view showing a structure of a photoelectric conversion device according to the first embodiment of the present invention, FIG. 2 is a sectional view along line II-II of FIG. 1, and FIGS. 3A to 3C are sectional views along lines IIIA-IIIA, IIIB-IIIB, and IIIC-IIIC of FIG. 1, respectively.

The photoelectric conversion device 1 includes a p-type silicon substrate 2, an $n^+$ type (n-plus type) common electrode layer 3, and a $p^-$ type (p-minus type) photoelectric conversion layer 4 sequentially stacked on the silicon substrate 2. The photoelectric conversion layer 4 has an almost uniform thickness (about 6 μm). The photoelectric conversion layer 4 is divided into a first photoelectric conversion region 6, a second photoelectric conversion region 7, and a third photoelectric conversion region 8 by means of an element dividing region 5. As shown in FIG. 1, the first to third photoelectric conversion regions 6, 7, and 8 are each shaped substantially like a square in planar viewing, i.e., when the silicon substrate 2 is vertically viewed from above.

The element dividing region 5 includes an oxide film 5A that is disposed on the surface of the photoelectric conversion layer 4 and that is formed according to a LOCOS (localized oxidation of silicon) process and an n-type diffusion dividing region 5B disposed between the oxide film 5A and the common electrode layer 4. The width (i.e., length in the direction along the silicon substrate 2) of the diffusion dividing region 5B is greater than the width (i.e., length in the direction along the silicon substrate 2) of the oxide film 5A.

In the first photoelectric conversion region 6, an $n^+$ type first dividing region 9 is formed at a predetermined depth from the surface of the photoelectric conversion layer 4 (i.e., at a thicknesswise middle portion of the first photoelectric conversion region 6). The first photoelectric conversion region 6 is divided into a first surface side region 6A closer to the surface of the device and a first substrate side region 6B closer to the silicon substrate 2 by means of the first dividing region 9. The first surface side region 6A is 2 μm to 3 μm in thickness.

The first dividing region 9 has a through hole 9a. The through hole 9a is shaped like a rectangle, for example. In this case, the length of one side of the through hole 9a is less than half of the length of one side of the first dividing region 9. The first surface side region 6A and the first substrate side region 6B communicate with each other through the through hole 9a therebetween.

In the second photoelectric conversion region 7, an $n^+$ type second dividing region 10 is formed at the same depth as the first dividing region 9 from the surface of the photoelectric conversion layer 4 (i.e., at a thicknesswise middle portion of the second photoelectric conversion region 7). The thickness of the second dividing region 10 is almost equal to that of the first dividing region 9. The second photoelectric conversion region 7 is divided into a second surface side region 7A closer to the surface thereof and a second substrate side region 7B closer to the silicon substrate 2 by means of the second dividing region 10.

The second dividing region 10 is formed at the same depth as the first dividing region 9, and hence the thickness of the second surface side region 7A is almost equal to that of the first surface side region 6A. Therefore, the second surface side region 7A is 2 μm to 3 μm in thickness.

In planar viewing, i.e., when the silicon substrate 2 is vertically viewed from above, the second dividing region 10 is formed in almost the same area as the second photoelectric conversion region 7, and dose not have a through hole by which the second surface side region 7A and the second substrate side region 7B communicate with each other. Therefore, the second surface side region 7A and the second substrate side region 7B are completely separated from each other by means of the second dividing region 10, and, as described later, only an electric current generated in the second surface side region 7A is used as a signal.

In the third photoelectric conversion region 8, an $n^+$ type third dividing region 11 is formed at a shallower depth than the second dividing region 9 from the surface of the photoelectric conversion layer 4 (i.e., at a thicknesswise middle point of the third photoelectric conversion region 8). The thickness of the third dividing region 11 is almost equal to that of the first dividing region 9 and that of the second dividing region 10. The third photoelectric conversion region 8 is divided into a third surface side region 8A closer to the surface thereof and a third substrate side region 8B closer to the silicon substrate 2 by means of the third dividing region 11.

The third dividing region 11 is formed at a shallower depth than the second dividing region 10, and hence the thickness of the third surface side region 8A is smaller than that of the second surface side region 7A. The third surface side region 8A is about 1 μm in thickness.

In planar viewing, i.e., when the silicon substrate 2 is vertically viewed from above, the third dividing region 11 is formed in almost the same area as the third photoelectric conversion region 8, and dose not have a through hole by which the third surface side region 8A and the third substrate side region 8B communicate with each other. Therefore, the third surface side region 8A and the third substrate side region 8B are completely separated from each other by means of the third dividing region 11, and, as described later, only an electric current generated in the third surface side region 8A is used as a signal.

The peripheries of the first to third dividing regions 9, 10, and 11 are connected to the diffusion dividing region 5B over all the peripheries.

N+ type first, second, and third uppermost surface part regions 12, 13, and 14 and p+ type (p-plus type) first, second, and third signal extracting regions 15, 16, and 17 are formed on the surface parts of the first, second, and third photoelectric conversion regions 6, 7, and 8, respectively.

In planar viewing, i.e., when the silicon substrate 2 is vertically viewed from above, the first, second, and third signal extracting regions 15, 16, and 17 are disposed one-sidedly with a deviation from the central parts of the first, second, and third photoelectric conversion regions 6, 7, and 8, respectively (i.e., one-sidedly in the direction in which the first, second, and third photoelectric conversion regions 6, 7, and 8 are arranged), as shown in FIG. 1. The first, second, and third uppermost surface part regions 12, 13, and 14 are disposed with a slight gap from the first, second, and third signal extracting regions 15, 16, and 17, respectively, in such a way as to surround the first, second, and third signal extracting regions 15, 16, and 17.

Each of the first, second, and third signal extracting regions 15, 16, and 17 are connected to the diffusion dividing region 5B of the element dividing region 5.

Referring to FIG. 2, the first dividing region 9, the first surface side region 6A, and the first substrate side region 6B constitute a first photodiode $D_{1A}$. The second dividing region 10 and the second surface side region 7A constitute a second photodiode $D_{2A}$. The third dividing region 11 and the third surface side region 8A constitute a third photodiode $D_{3A}$.

The first uppermost surface part region 12 and the first surface side region 6A constitute a first surface photodiode $D_{1B}$. The second uppermost surface part region 13 and the second surface side region 7A constitute a second surface photodiode $D_{2B}$. The third uppermost surface part region 14 and the third surface side region 8A constitute a third surface photodiode $D_{3B}$.

In the photoelectric conversion device 1, areas partitioned by the element dividing region 5 serve as first, second, and third sensors 21, 22, and 23 that include the first, second, and third photodiodes $D_{1A}$, $D_{2A}$, and $D_{3A}$ and the first, second, and third surface photodiodes $D_{1B}$, $D_{2B}$, and $D_{3B}$, respectively.

Anode electrodes (signal extracting electrodes) 24, 25, and 26 are connected to the first, second, and third signal extracting regions 15, 16, and 17, respectively. Photocurrents (photoelectromotive forces) generated in the first, second, and third photodiodes $D_{1A}$, $D_{2A}$, and $D_{3A}$ and the first, second, and third surface photodiodes $D_{1B}$, $D_{2B}$, and $D_{3B}$ can be extracted individually in each of the first, second, and third sensors 21, 22, and 23.

Although the single first sensor 21, the single second sensor 22, and the single third sensor 23 are shown in FIGS. 1, 2, and 3A to 3C, the photoelectric conversion device 1 may include plural sets of the first, second, and third sensors 21, 22, and 23. In this case, plural sets of the first, second, and third sensors 21, 22, and 23 are arranged linearly or two-dimensionally in the in-plane direction of the silicon substrate 2.

Additionally, in accordance with the purpose of use, only one of the first, second, and third sensors 21, 22, and 23 may be used.

The common electrode layer 3 is formed in an area extending over the first, second, and third sensors 21, 22, and 23, and the diffusion dividing region 5B of each element dividing region 5 is connected to the common electrode layer 3. Therefore, the first, second, and third dividing regions 9, 10, 11 and the first, second, and third uppermost surface part regions 12, 13, and 14 are connected to the common electrode layer 3 through the diffusion dividing region 5B.

The conductivity type of all of the first to third dividing regions 9, 10, and 11, the first to third uppermost surface part regions 12, 13, and 14, the diffusion dividing region 5B, and the common electrode layer 3 is n+ type or n-type. Therefore, a reverse bias voltage can be simultaneously applied to the first to third photodiodes $D_{1A}$, $D_{2A}$, and $D_{3A}$ and the first to third surface photodiodes $D_{1B}$, $D_{2B}$, and $D_{3B}$ through the common electrode layer 3.

A quantity of carriers corresponding to the quantity of incident light are generated in the photoelectric conversion layer 4. In the first sensor 21, since the first surface side region 6A and the first substrate side region 6B communicate with each other through the through hole 9a, both carriers generated in the first surface side region 6A and carriers generated in the first substrate side region 6B can move to the anode electrode 24 through the first signal extracting region 15.

Therefore, in the first photodiode $D_{1A}$ and the first surface photodiode $D_{1B}$, it is possible to extract photocurrent (photoelectromotive force) having intensity corresponding to the quantity of carriers generated in the first surface side region 6A and in the first substrate side region 6B.

On the other hand, carriers generated in the second and third surface side regions 7A and 8A can move to the anode electrodes 25 and 26 through the second and third signal extracting regions 16 and 17, respectively, whereas carriers generated in the second and third substrate side regions 7B and 8B are obstructed by the second and third dividing regions 10 and 11, respectively, and cannot move to the anode electrodes 25 and 26.

Therefore, in the second photodiode $D_{2A}$ and the second surface photodiode $D_{2B}$, only photocurrent (photoelectromotive force) having intensity corresponding to the quantity of carriers generated in the second surface side region 7A can be extracted, and, in the third photodiode $D_{3A}$ and the third surface photodiode $D_{3B}$, only photocurrent (photoelectromotive force) having intensity corresponding to the quantity of carriers generated in the third surface side region 8A can be extracted. In other words, photocurrent corresponding chiefly to red light generated in the second substrate side region 7B or in the third substrate side region 8B can be adjusted not to be used for an arithmetical operation to calculate the quantity of received light (described later).

Figure 4:
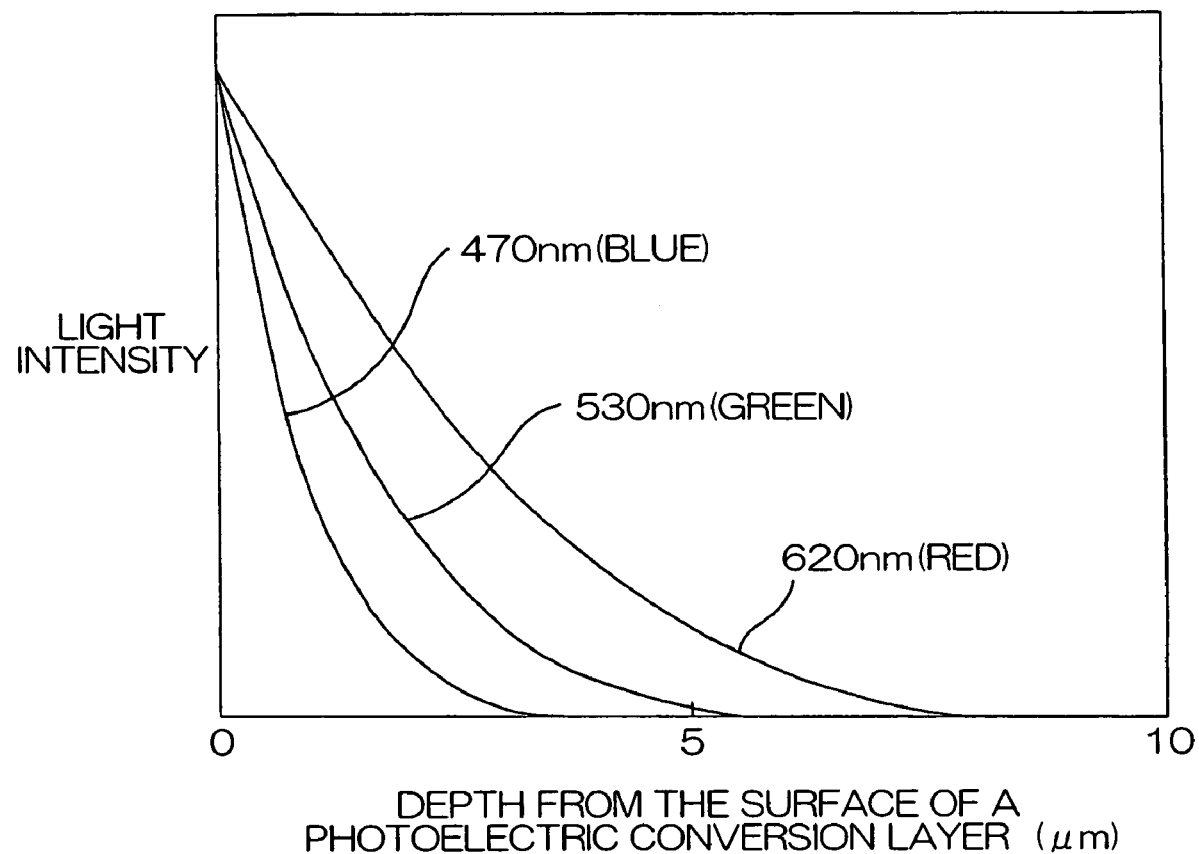
FIG. 4 is a graph exhibiting a relationship between a depth from the surface of a photoelectric conversion layer and light intensity.

FIG. 4 is a graph exhibiting a relationship between a depth from the surface of the photoelectric conversion layer 4 and light intensity.

Since light that has entered the photoelectric conversion layer 4 from the surface thereof is absorbed by the photoelectric conversion layer 4, light intensity becomes smaller in proportion to an increase in the depth from the surface of the photoelectric conversion layer 4. At this time, the absorption by the photoelectric conversion layer 4 of light becomes smaller as light wavelength increases, and incident light reaches a deeper place of the photoelectric conversion layer 4.

Therefore, light (red light) having a wavelength of 620 nm reaches the depth more than 6 μm from the surface of the photoelectric conversion layer 4. However, light (green light) having a wavelength of 530 nm reaches the depth no more than about 5 μm from the surface of the photoelectric conversion layer 4, and light (blue light) having a wavelength of 470 nm reaches the depth no more than about 3 μm from the surface of the photoelectric conversion layer 4. That is, the second surface side region 7A cannot sufficiently absorb red light, and the third surface side region 8A cannot sufficiently absorb red light and green light.

Therefore, in the first surface side region 6A and the first substrate side region 6B, light having wavelengths ranging from red light to blue light is absorbed, and a quantity of carriers corresponding to the quantity of the light are generated. In the second surface side region 7A, light having wavelengths ranging chiefly from green light to blue light is absorbed, and a quantity of carriers corresponding to the quantity of the light are generated. In the third surface side region 8A, light having wavelengths chiefly close to blue light is absorbed, and a quantity of carriers corresponding to the quantity of the light are generated.

In other words, the total thickness of the first surface side region 6A and the first substrate side region 6B is set so that light having wavelengths ranging from red light to blue light can be absorbed. The thickness of the second surface side region 7A is set so that light having wavelengths ranging from green light to blue light can be absorbed. The thickness of the third surface side region 8A is set so that light having wavelengths close to blue light can be absorbed.

Accordingly, in the first photodiode $D_{1A}$ and the first surface photodiode $D_{1B}$ (first sensor 21), photocurrent (photoelectromotive force) corresponding to the quantity of carriers by red to blue light generated in the first substrate side region 6B and in the first surface side region 6A is generated. Likewise, in the second photodiode $D_{2A}$ and the second surface photodiode $D_{2B}$ (second sensor 22), photocurrent (photoelectromotive force) corresponding to the quantity of carriers by green to blue light generated in the second surface side region 7A is generated. In the third photodiode $D_{3A}$ and the third surface photodiode $D_{3B}$ (third sensor 23), photocurrent (photoelectromotive force) corresponding to the quantity of carriers by blue light generated in the third surface side region 8A is generated.

Since the oxide film 5A is formed, a leakage current between the adjoining sensors 21, 22, and 23 is slight in the surface part of the photoelectric conversion layer 4.

Since the first, second, and third sensors 21, 22, and 23 differ from each other in a combination of red light, green light, and blue light that are absorbed so as to generate photocurrent as described above, the quantity of red light, the quantity of green light, and the quantity of blue light can be calculated by performing arithmetic processing based on values of the photocurrent (photoelectromotive force). In other words, concerning three kinds of wavelengths, the quantity of light received by the first, second, and third sensors 21, 22, and 23 can be calculated by the photoelectric conversion device 1, independently of filters or light absorbing members.

Additionally, if the photoelectric conversion device 1 includes plural sets of the first, second, and third sensors 21, 22, and 23, the distribution of the quantity of light about three kinds of wavelengths can be obtained with respect to a direction in which the first, second, and third sensors 21, 22, and 23 are arranged.

If the first dividing region 9 having the through hole 9a is not provided in the first photoelectric conversion region 6, a depletion layer extends from an interface between the first photoelectric conversion region 6 and the first uppermost surface part region 12 and from an interface between the first photoelectric conversion region 6 and the common electrode layer 3. In contrast, if the first dividing region 9 is provided as in the photoelectric conversion device 1, a depletion layer extends from an interface between the first surface side region 6A and the first dividing region 9 and from an interface between the first substrate side region 6B and the first dividing region 9, as well as from the interface between the first photoelectric conversion region 6 (first surface side region 6A) and the first uppermost surface part region 12 and from the interface of the first photoelectric conversion region 6 (first substrate side region 6B) and the common electrode layer 3.

Since voltage needed to completely deplete a semiconductor layer depends on the thickness of the semiconductor layer, voltage needed to almost completely deplete the first surface side region 6A and the first substrate side region 6B can be made smaller than in a case in which the first dividing region 9 is not formed. Therefore, the thus structured photoelectric conversion device 1 is suitable for portable devices on which the demand of low power consumption is urged.

Figure 5:
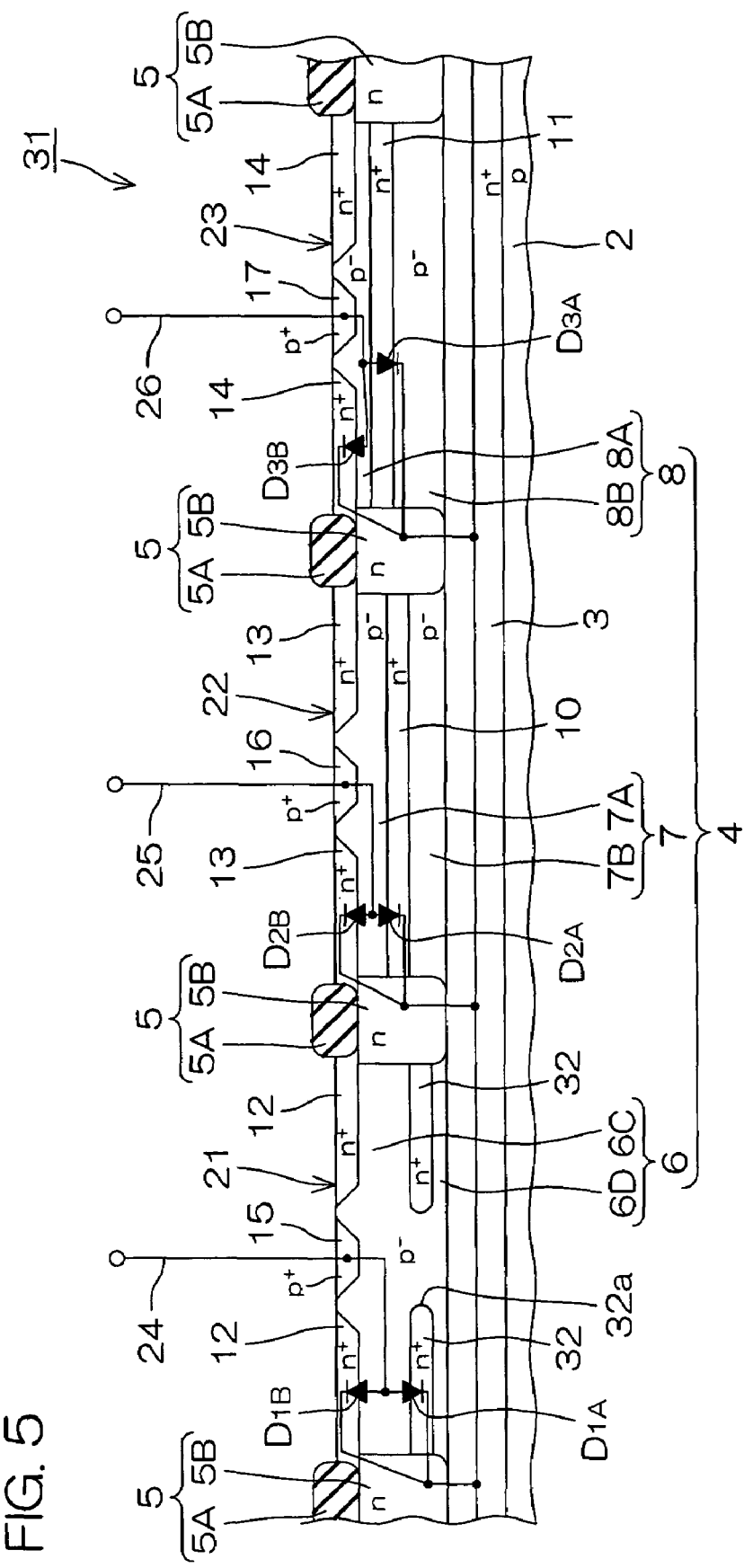
FIG. 5 is a schematic sectional view showing a structure of a photoelectric conversion device according to a second embodiment of the present invention.

FIG. 5 is a schematic sectional view showing a structure of a photoelectric conversion device according to the second embodiment of the present invention. In FIG. 5, the same reference characters as in FIG. 2 are given to elements corresponding to those of FIG. 2, and a description thereof is omitted.

In the photoelectric conversion device 31, a first dividing region 32 corresponding to the first dividing region 9 is formed at a deeper position from the surface of the photoelectric conversion layer 4 than the first dividing region 9. Therefore, in the photoelectric conversion layer 4 of the photoelectric conversion device 31, the first dividing region 32 is formed at a deeper position than the second dividing region 10.

Accordingly, the thickness of a first surface side region 6C corresponding to the first surface side region 6A is greater than that of the first surface side region 6A, and the thickness of a first substrate side region 6D corresponding to the first substrate side region 6B is smaller than that of the first substrate side region 6B.

The total thickness of the first surface side region 6C and the first substrate side region 6D is almost equal to the total thickness of the first surface side region 6A and the first substrate side region 6B, and is greater than the thickness of the second surface side region 7A. Therefore, likewise, in the photoelectric conversion device 31, light in a wider wavelength range toward the side of longer wavelengths is absorbed so as to generate carriers in the first photoelectric conversion region 6 than in the second photoelectric conversion region 7. However, a larger quantity of light is absorbed in the surface side region (first surface side region 6C) than in the first photoelectric conversion region 6 of the photoelectric conversion device 1, and carriers are generated.

FIGS. 6A to 6F are schematic sectional views for explaining a method for manufacturing the photoelectric conversion device 31.

Figure 6:
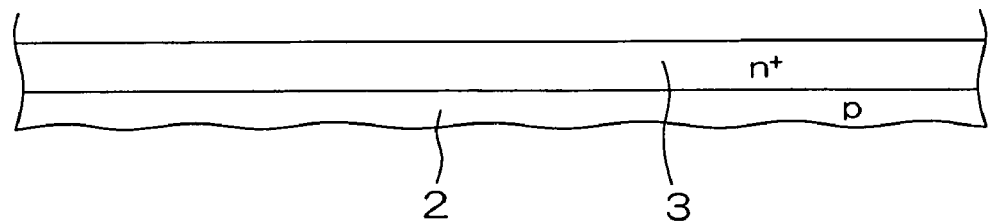
FIGS. 6A to 6F are schematic sectional views for explaining a method for manufacturing the photoelectric conversion device shown in FIG. 5.

First, n-type impurities (e.g., arsenic (As)) are applied on to one surface of the silicon substrate 2, and an $n^+$ type common electrode layer 3 is formed on the surface part of the silicon substrate 2 (see FIG. 6A). The common electrode layer 3 may be formed by applying arsenic glass on to one surface of the silicon substrate 2 and by diffusing arsenic from this arsenic glass into the silicon substrate 2.

Figure 6B:
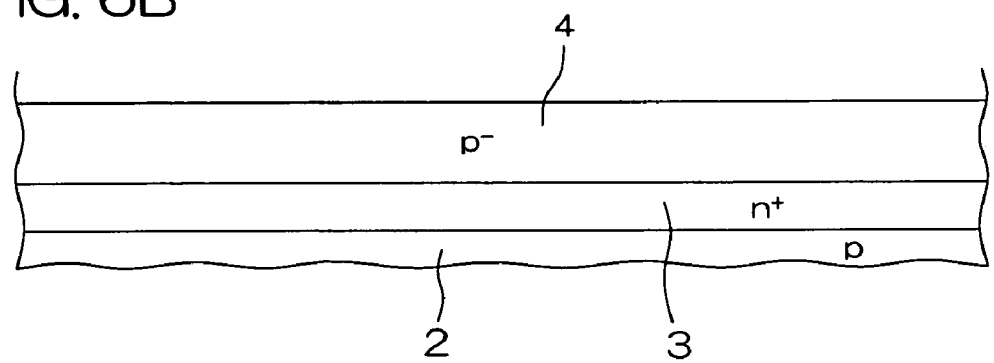

Thereafter, a $p^-$ type photoelectric conversion layer 4 having a thickness of 6 μm to 8 μm is formed on the common electrode layer 3 according to epitaxial growth (see FIG. 6B).

Thereafter, n-type impurities (e.g., phosphorus (P)) are injected into a predetermined area of the photoelectric conversion layer 4 from the surface thereof through an opening of a resist film having predetermined patterns. The n-type impurities are then diffused into the depths of the photoelectric conversion layer 4, and an n-type diffusion dividing region 5B is formed. The n-type impurities are allowed to reach an interface between the common electrode layer 3 and the photoelectric conversion layer 4 by the diffusion. As a result, the diffusion dividing region 5B connected to the common electrode layer 3 is obtained. The diffusion dividing region 5B is exposed on the surface of the photoelectric conversion layer 4.

Figure 6C:
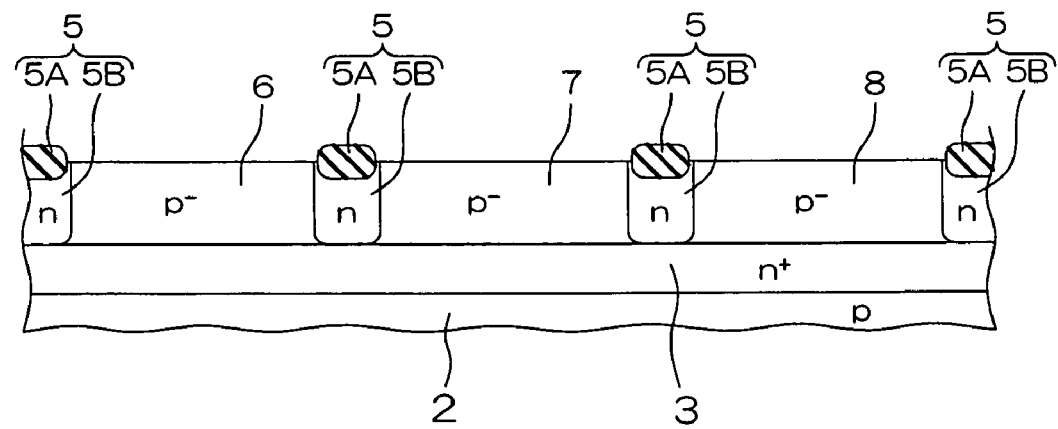

Further, according to a known LOCOS technique, a predetermined area of the surface part of the diffusion dividing region 5B is selectively oxidized, thus forming an oxide film 5A. The width of the oxide film 5A is made to be smaller than the width of, for example, the diffusion dividing region 5B, in this case, after forming the oxide film 5A, the diffusion dividing region 5B is exposed around the oxide film 5A. The photoelectric conversion layer 4 is divided into the first, second, and third photoelectric conversion regions 6, 7, and 8 by means of the element dividing region 5 including the oxide film 5A and the diffusion dividing region 5B. This state is shown in FIG. 6C.

Figure 6D:
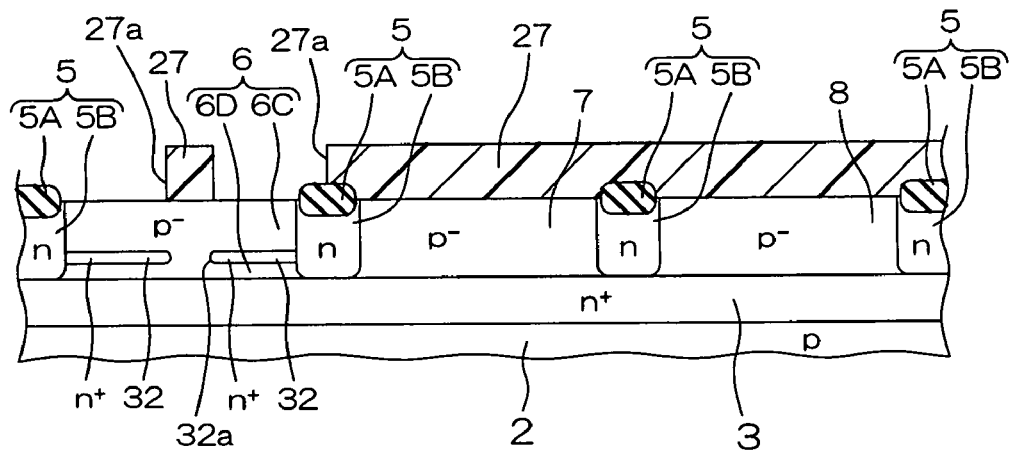

Thereafter, a resist film 27 (mask) to form the first dividing region 9 is formed on the photoelectric conversion layer 4 and the element dividing region 5 (see FIG. 6D). The resist film 27 has an opening 27a. The first photoelectric conversion region 6 is exposed in the opening 27a. The resist film 27 is also formed on a region corresponding to a through hole 32a (see FIG. 5) of the first dividing region 32. The element dividing region 5 around the periphery of the first photoelectric conversion region 6 may be exposed in the opening 27a.

For example, the resist film 27 having the opening 27a can be obtained by applying a precursor of the resist film 27 wholly onto the photoelectric conversion layer 4 and the element dividing region 5, then forming the opening 27a by exposure and development, and hardening the remaining precursor.

N-type impurities (e.g., phosphorus) are injected through the opening 27a with first predetermined injecting energy (e.g., 3.0 MeV to 3.5 MeV) in this state, and the first dividing region 32 having the through hole 32a is formed at a predetermined depth of the first photoelectric conversion region 6. The depth to which impurities are injected depends on injecting energy, and impurities are injected into a deeper place of the photoelectric conversion layer 4 as injecting energy increases. Therefore, the first dividing region 32 can be formed at a predetermined depth by controlling the injecting energy of the impurities.

The first photoelectric conversion region 6 is divided into the first surface side region 6C closer to the surface thereof and the first substrate side region 6D closer to the silicon substrate 2 by means of the first dividing region 32. The first surface side region 6C and the first substrate side region 6D communicate with each other through the through hole 32a therebetween.

Figure 6E:
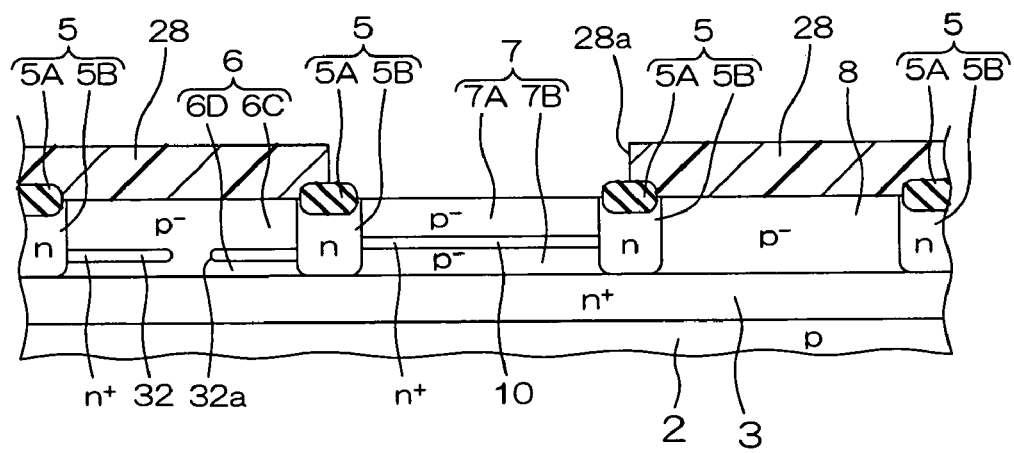

Thereafter, the resist film 27 is removed, and a resist film 28 to form the second dividing region 10 is formed (see FIG. 6E). The resist film 28 has an opening 28a, and the second photoelectric conversion region 7 is exposed in the opening 28a. The element dividing region 5 around the periphery of the second photoelectric conversion region 7 may be exposed in the opening 28a. The resist film 28 can be formed according to the same process as the resist film 27.

N-type impurities (e.g., phosphorus) are injected through the opening 28a with second injecting energy (e.g., 2.0 MeV to 3.0 MeV), which is smaller than the first injecting energy, in this state, and the second dividing region 10 is formed at a predetermined depth of the second photoelectric conversion region 7. As a result, the second dividing region 10 is formed at a shallower depth than the first dividing region 32. The second photoelectric conversion region 7 is divided into the second surface side region 7A closer to the surface thereof and the second substrate side region 7B closer to the silicon substrate 2 by means of the second dividing region 10.

Figure 6F:
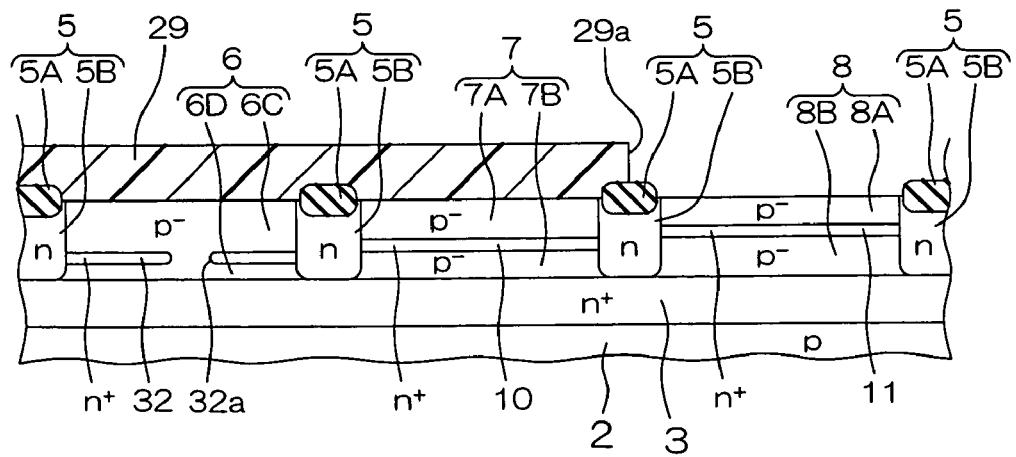

Thereafter, the resist film 28 is removed, and a resist film 29 to form the third dividing region 11 is formed (see FIG. 6F). The resist film 29 has an opening 29a, and the third photoelectric conversion region 8 is exposed in the opening 29a. The element dividing region 5 around the periphery of the third photoelectric conversion region 8 may be exposed in the opening 29a. The resist film 29 can be formed according to the same process as the resist film 27.

N-type impurities (e.g., phosphorus) are injected through the opening 29a with third injecting energy (e.g., 1.0 MeV to 2.0 MeV), which is smaller than the second injecting energy, in this state. The third dividing region 11 is formed at a predetermined depth of the third photoelectric conversion region 8. As a result, the third dividing region 11 is formed at a shallower depth than the second dividing region 10. The third photoelectric conversion region 8 is divided into the first surface side region 8A closer to the surface thereof and the third substrate side region 8B closer to the silicon substrate 2 by means of the third dividing region 11.

Thereafter, n-type impurities are injected to the surface part of the photoelectric conversion layer 4 through the opening of the resist film having a predetermined pattern, and the n$^+$ type first, second, and third uppermost surface part regions 12, 13 and 14 are formed. If the diffusion dividing region 5B is exposed around the oxide film 5A, the first, second, and third uppermost surface part regions 12, 13, and 14 and the diffusion dividing region 5B can be easily connected together.

Further, p-type impurities are injected to the surface part of the photoelectric conversion layer 4 through the opening of the resist film having a predetermined pattern, and p$^+$ type first, second, and third signal extracting regions 15, 16, and 17 are formed. As a result, the photoelectric conversion device 31 shown in FIG. 5 is obtained.

As described above, there is no need to form filters or light absorbing members in a process for producing the photoelectric conversion device 1, and hence, unlike the conventional technique, there is no need to form an opening at a filter or a light absorbing member for a connection of the anode electrodes 24, 25, and 26 to the first, second, and third signal extracting regions 15, 16, and 17. Therefore, the photoelectric conversion device 1 can be produced at reduced manufacturing costs.

In producing the photoelectric conversion device 1 shown in FIGS. 1, 2, 3A, 3B, and 3C, in the manufacturing method mentioned above, impurities-injecting energy needed when the first dividing region 32 (9) is formed is made to be almost equal to that needed when the second dividing region 10 is formed. As a result, the first and second dividing regions 9 and 10 are formed at almost the same depth from the surface of the photoelectric conversion layer 4.

In this case, the first and second dividing regions 9 and 10 can be simultaneously formed by forming a resist film having an opening where the first and second photoelectric conversion regions 6 and 7 are exposed and by injecting impurities through this opening, instead of individually forming the resist films 27 and 28 and injecting impurities. As a result, the number of producing steps can be reduced. It is, of course, permissible to individually form the resist films 27 and 28 and individually form the first and second dividing regions 9 and 10 with the same impurities-injecting energy.

Figure 7:
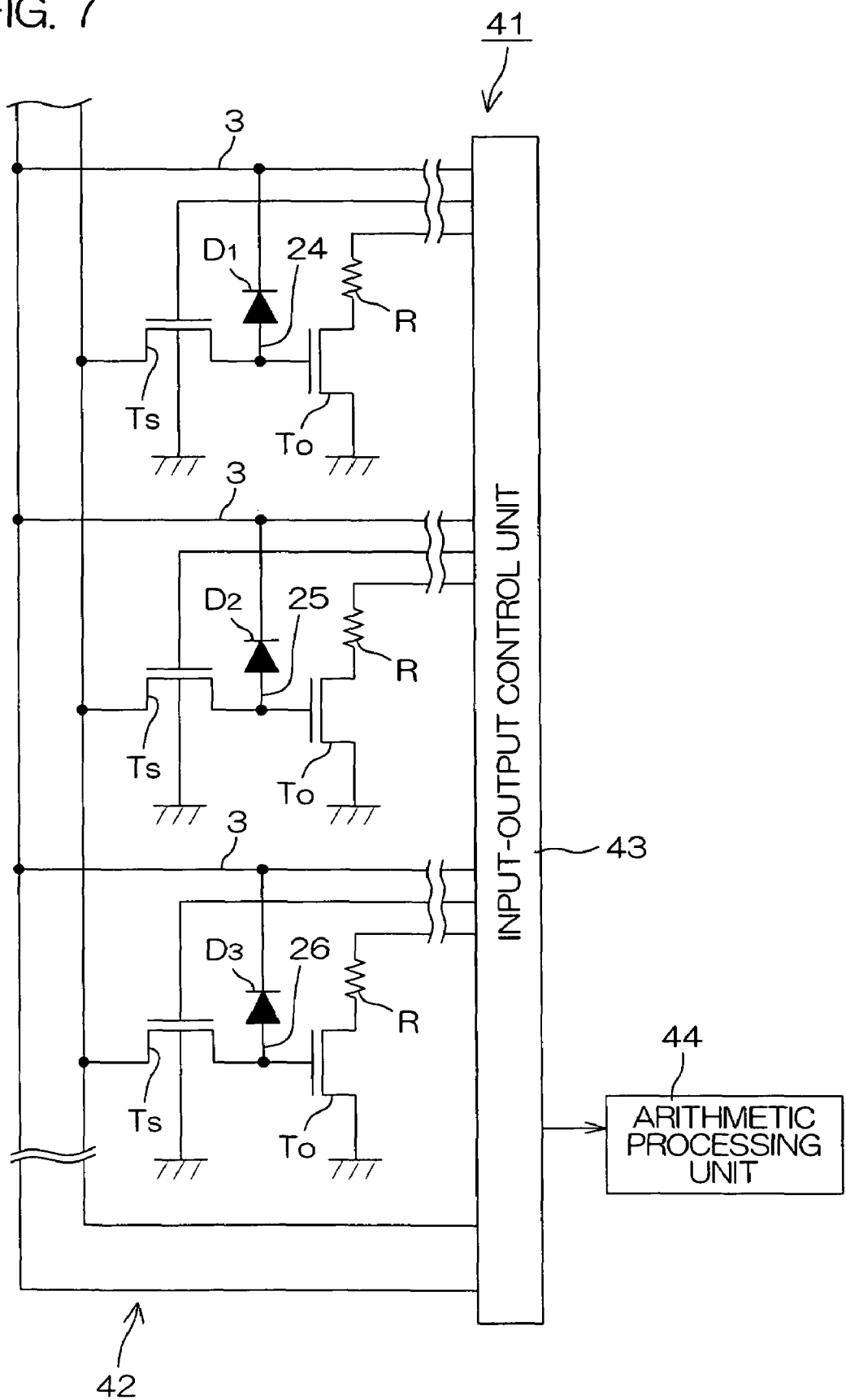
FIG. 7 is a circuit diagram of an image sensor including the photoelectric conversion device shown in FIGS. 1, 2, 3A, 3B, and 3C and a drive circuit thereof.
Figure 8:
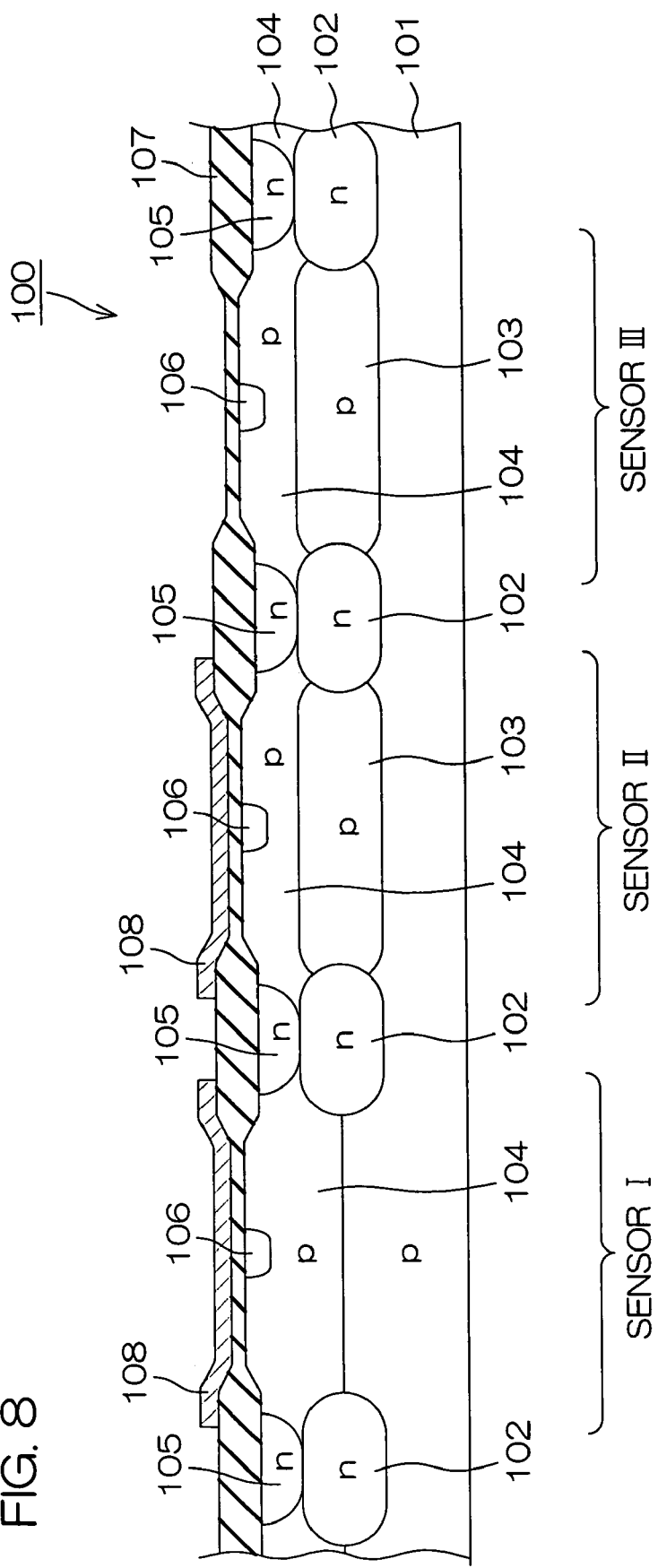
FIG. 8 is a schematic sectional view showing a structure of a conventional photoelectric conversion device.

FIG. 7 is an example of a circuit diagram of an image sensor including the photoelectric conversion device shown in FIGS. 1, 2, 3A, 3B, and 3C and a drive circuit thereof. In FIG. 7, a first photodiode $D_{1A}$ and a first surface photodiode $D_{1B}$ connected in parallel are shown by one photodiode $D_1$, a second photodiode $D_{2A}$ and a second surface photodiode $D_{2B}$ connected in parallel are shown by one photodiode $D_2$, and a third photodiode $D_{3A}$ and a third surface photodiode $D_{3B}$ connected in parallel are shown by one photodiode $D_3$.

This image sensor 41 includes the photoelectric conversion device 1 (in FIG. 7, only the photodiodes $D_1$, $D_2$, and $D_3$ are shown) and a drive circuit 42. The drive circuit 42 includes an input-output control unit 43 that performs the input and output of electric signals with the photodiodes $D_1$, $D_2$, and $D_3$ and an arithmetic processing unit 44 that performs arithmetic processing based on output signals obtained from the photodiodes $D_1$, $D_2$, and $D_3$ and calculates the quantity of red light, the quantity of green light, and the quantity of blue light.

Cathode electrodes of the photodiodes $D_1$, $D_2$, and $D_3$ are connected to the input-output control unit 43 through the common electrode layer 3. A reverse bias voltage can be applied to the photodiodes $D_1$, $D_2$, and $D_3$ together through the common electrode layer 3 by means of the input-output control unit 43. The reverse bias voltage applied to the photodiodes $D_1$, $D_2$, and $D_3$ is large enough to almost completely deplete all of the first substrate side region 6B and the first, second, and third surface side regions 6A, 7A, and 8A (see FIG. 2).

On the other hand, each of the anode electrodes 24, 25, and 26 for signal extraction of the photodiodes $D_1$, $D_2$, and $D_3$ is connected to one of source/drain electrodes of a switch transistor Ts. The other ones of the source/drain electrodes of the switch transistors Ts are connected commonly and lead to the input-output control unit 43, whereby discharge voltage can be applied to each of the switch transistors Ts.

A predetermined gate voltage is individually applied to a gate electrode of each of the switch transistors Ts from the input-output control unit 43 so that each switch transistor Ts can be individually turned on. An electric potential on the side of the anode electrodes 24, 25, and 26 of the photodiodes $D_1$, $D_2$, and $D_3$ corresponding thereto can be reset at a predetermined electric potential (reference electric potential) by turning the switch transistors Ts on.

The anode electrodes 24, 25, and 26 of the photodiodes $D_1$, $D_2$, and $D_3$ are connected to gate electrodes of output transistors To, respectively. One of source/drain electrodes of the output transistor To is grounded, and the other one is connected to the input-output control unit 43 through a resistor R.

A predetermined voltage can be applied between the source/drain electrodes of the output transistor To by means of the input-output control unit 43. In the output transistor To, a drain current corresponding to the electric potential of the gate electrode flows between the source/drain electrodes when a predetermined voltage is applied between the source/drain electrodes. The input-output control unit 43 can individually measure the magnitude of this electric current (hereinafter, referred to as "output signal").

When the photoelectric conversion device 1 is driven by the drive circuit 42 in the image sensor 41, a reverse bias voltage is first applied to all of the photodiodes $D_1$, $D_2$, and $D_3$ by the input-output control unit 43. As a result, the first substrate side region 6B and the first, second, and third surface side regions 6A, 7A, and 8A of all of the photodiodes $D_1$, $D_2$, and $D_3$ are almost completely depleted.

Thereafter, the switch transistor Ts connected to the photodiode $D_1$ from which an output signal is obtained is turned on for a predetermined time by the input-output control unit 43. As a result, the electric potential on the side of the anode electrode 24 of the photodiode $D_1$ reaches a predetermined potential, such as ground potential (GND).

Thereafter, when the output transistor To is turned on, the electric potential on the side of the anode electrode 24 of the photodiode $D_1$ is changed from the predetermined potential mentioned above by a photoelectromotive force that corresponds to the quantity of incident light and that is generated by the photodiode $D_1$. That is, the gate voltage of the output transistor To varies, and, in response thereto, the drain current (output signal) flowing through the output transistor To varies. A variation of the output signal obtained at this time or a (final) current value obtained after the output signal varies is measured by the input-output control unit 43. Thus, an electric signal corresponding to the quantity of light received by the photodiode $D_1$ is obtained.

In the same way as in the photodiode $D_1$, a variation of the output signal of the output transistors To connected to the photodiodes $D_2$ and $D_3$ or a current value obtained after the output signal varies is measured by the input-output control unit 43. Thus, electric signals corresponding to the quantity of light received by the photodiodes $D_2$ and $D_3$ is obtained. Electric signals of the set of the photodiodes $D_1$, $D_2$, and $D_3$ are obtained through these operations.

Electric signals obtained in this way are sent to the arithmetic processing unit 44. The quantity of red light, the quantity of green light, and the quantity of blue light are calculated by the arithmetic processing unit 44.

Since the image sensor 41 has the photoelectric conversion device 1 that can be produced at reduced manufacturing costs, the image sensor 41 can be produced at low cost.

Likewise, the photoelectric conversion device 31 shown in FIG. 5 can be driven by the same drive circuit 42.

The present invention has been described as above according to the foregoing embodiment, but can be carried out according to modifications. For example, the uppermost surface part regions 12, 13, and 14 may not be provided in the photoelectric conversion device 1 or in the photoelectric conversion device 31. In other words, the sensors 21, 22, and 23 may not be provided with the first, second, and third surface photodiodes $D_{1B}$, $D_{2B}$, and $D_{3B}$, respectively.

In a process for producing the photoelectric conversion device 31, the order in which the first, second, and third dividing regions 32, 10, and 11 are formed can be arbitrarily set without being limited to the foregoing order. For example, these may be formed in order in which impurities-injecting energy applied when formed is small, i.e., in order of the third dividing region 11, the second dividing region 10, and the first dividing region 32.

Likewise, in a process for producing the photoelectric conversion device 1, the first, second, and third dividing regions 9, 10, and 11 can be formed in arbitrary order.

Additionally, although the respective light receiving areas of the first, second, and third sensors 21, 22, and 23 of the photoelectric conversion device 1 (i.e., the respective exposed areas of the first, second, and third photoelectric conversion regions 6, 7, and 8) are substantially equal to each other in FIG. 1, the light receiving areas of the first, second, and third sensors 21, 22, and 23 may differ from each other.

Additionally, the first, second, and third signal extracting regions 15, 16, and 17 may be provided at the corner of their light receiving surfaces (i.e., at the corner of the exposed surfaces of the first, second, and third photoelectric conversion regions 6, 7, and 8). Although the first signal extracting region 15 is formed above the through holes 9a or 32a in the foregoing embodiment in such a way as to substantially lie over the through holes 9a or 32a in planar viewing, the first signal extracting region 15 may be formed with a deviation from the through holes 9a, 32a.

The embodiment of the present invention has been described in detail as above. However, this is merely a concrete example used to clarify the technical contents of the present invention. Therefore, the present invention should not be understood while being limited to the concrete example. The spirit and scope of the present invention are limited only by the appended claims.

This application is based on Japanese Patent Application No. 2004-138723, filed in Japan Patent Office on May 7, 2004, the entire contents of which are hereby incorporated by reference.

What is claimed is:

1. A photoelectric conversion device comprising:
a photoelectric conversion layer of a first conductivity type, the photoelectric conversion layer being stacked on a semiconductor substrate;
an element dividing region of a second conductivity type, the element dividing region being formed in the photoelectric conversion layer, the element dividing region dividing the photoelectric conversion layer into a first photoelectric conversion region, a second photoelectric conversion region, and a third photoelectric conversion region, wherein the first to third photoelectric conversion regions are arranged in a direction parallel to the semiconductor substrate;
a first dividing region of the second conductivity type, the first dividing region being formed at a predetermined depth from a surface of the photoelectric conversion layer in the first photoelectric conversion region, the first dividing region dividing the first photoelectric conversion region into a first surface side region closer to the surface thereof and a first substrate side region closer to the semiconductor substrate, the first dividing region having a through hole through which the first surface side region and the first substrate side region communicate with each other;
a second dividing region of the second conductivity type, the second dividing region being formed at substantially the same depth as the first dividing region or at a shallower depth than the first dividing region in the second photoelectric conversion region, the second dividing region dividing the second photoelectric conversion region into a second surface side region closer to the surface thereof and a second substrate side region closer to the semiconductor substrate, wherein the second surface side region and the second substrate side region are completely separated from each other by means of the second dividing region; and
a third dividing region of the second conductivity type, the third dividing region being formed at a shallower depth than the second dividing region in the third photoelectric conversion region, the third dividing region dividing the third photoelectric conversion region into a third surface side region closer to the surface thereof and a third substrate side region closer to the semiconductor substrate, wherein the third surface side region and the third substrate side region are completely separated from each other by means of the third dividing region.

2. An image sensor comprising:
a photoelectric conversion device; and
a drive circuit that drives the photoelectric conversion device;
the photoelectric conversion device comprising:
a photoelectric conversion layer of a first conductivity type, the photoelectric conversion layer being stacked on a semiconductor substrate;
an element dividing region of a second conductivity type, the element dividing region being formed in the photoelectric conversion layer, the element dividing region dividing the photoelectric conversion layer into a first photoelectric conversion region, a second photoelectric conversion region, and a third photoelectric conversion region, wherein the first to third photoelectric conversion regions are arranged in a direction parallel to the semiconductor substrate;
a first dividing region of the second conductivity type, the first dividing region being formed at a predetermined depth from a surface of the photoelectric conversion layer in the first photoelectric conversion region, the first dividing
region dividing the first photoelectric conversion region into a first surface side region closer to the surface thereof and a first substrate side region closer to the semiconductor substrate, the first dividing region having a through hole through which the first surface side region and the first substrate side region communicate with each other;
a second dividing region of the second conductivity type, the second dividing region being formed at substantially the same depth as the first dividing region or at a shallower depth than the first dividing region in the second photoelectric conversion region, the second dividing region dividing the second photoelectric conversion region into a second surface side region closer to the surface thereof and a second substrate side region closer to the semiconductor substrate, wherein the second surface side region and the second substrate side region are completely separated from each other by means of the second dividing region; and
a third dividing region of the second conductivity type, the third dividing region being formed at a shallower depth than the second dividing region in the third photoelectric conversion region, the third dividing region dividing the third photoelectric conversion region into a third surface side region closer to the surface thereof and a third substrate side region closer to the semiconductor substrate, wherein the third surface side region and the third substrate side region are completely separated from each other by means of the third dividing region.

* * * * *